United States Patent
Vaufrey et al.

(10) Patent No.: US 8,030,647 B2
(45) Date of Patent: Oct. 4, 2011

(54) TRANSMITTER AND ASSOCIATED DISPLAY DEVICE

(75) Inventors: David Vaufrey, Grenoble (FR); Philippe Le Roy, Betton (FR); Christophe Prat, Coueron (FR)

(73) Assignee: Thomson Licensing, Boulogne-Billancourt (FR)

( * ) Notice: Subject to any disclaimer, the term of this patent is extended or adjusted under 35 U.S.C. 154(b) by 0 days.

(21) Appl. No.: 12/308,784

(22) PCT Filed: Jun. 26, 2007

(86) PCT No.: PCT/FR2007/001065
§ 371 (c)(1),
(2), (4) Date: Jan. 22, 2010

(87) PCT Pub. No.: WO2008/000948
PCT Pub. Date: Jan. 3, 2008

(65) Prior Publication Data
US 2010/0127245 A1  May 27, 2010

(30) Foreign Application Priority Data

Jun. 30, 2006 (FR) ...................................... 06 05956

(51) Int. Cl.
*H05B 33/00* (2006.01)
(52) U.S. Cl. ............................................. 257/40; 345/76
(58) Field of Classification Search .................... 257/40; 345/76–79, 103
See application file for complete search history.

(56) References Cited

U.S. PATENT DOCUMENTS

| 2001/0001485 A1 | 5/2001 | Bao et al. | |
| 2004/0012330 A1* | 1/2004 | Ohshita et al. | 313/504 |
| 2004/0164671 A1 | 8/2004 | Noguchi | |
| 2004/0207577 A1* | 10/2004 | Ito et al. | 345/76 |

OTHER PUBLICATIONS

Search Report Dated Nov. 29, 2007.

* cited by examiner

*Primary Examiner* — Thomas L Dickey
(74) *Attorney, Agent, or Firm* — Robert D. Shedd; Harvey D. Fried; James McKenzie

(57) ABSTRACT

The invention relates to a light transmitter comprising two electrodes facing each other, and at least one light-emitting organic layer with two ends. The thickness of the organic layer varies continuously between the two ends. The invention also relates to a display device comprising such a transmitter.

18 Claims, 4 Drawing Sheets

TRANSMITTER AND ASSOCIATED DISPLAY DEVICE

This application claims the benefit, under 35 U.S.C. §365 of International Application PCT/FR2007/001065, filed Jun. 26, 2007, which was published in accordance with PCT Article 21(2) on Jan. 3, 2008 in French and which claims the benefit of French patent application No. 0605956, filed Jun. 30, 2006.

According to a first aspect, the invention relates to an emitter of the type comprising two electrodes facing each other and at least one organic layer capable of emitting light.

This type of organic emitter is used in a passive-matrix display device in which the pixels are formed by organic layers in an array form that are placed at the intersection of anode rows and cathode columns. Each organic layer is located between several anodes and one cathode. The anode rows and the cathode columns are activated sequentially so that part of an organic layer located between an anode row and a cathode column emits light.

However, these emitters and their addressing means are too complex to be used in a view-meter display device.

According to the first aspect, the object of the invention is to provide a simpler emitter.

For this purpose, one subject of the invention is an emitter of the aforementioned type, characterized in that it comprises at least a first part and a second part placed between the same two electrodes, and in that a thickness and/or a composition of the first part are/is different from said thickness and/or said composition of the second part, said thickness being defined between the two electrodes.

According to a second aspect, the invention relates to a display device.

A display device of the view-meter type comprising several light-emitting diodes distributed along a row and connected to a driver and to a power supply device, capable of supplying each diode with a predetermined voltage of the same value, is known. The driver is capable of receiving an input signal and of supplying, sequentially and in a discrete manner, a certain number of diodes according to the value of the input signal, in such a way that the number of diodes lit is representative of the input signal.

This display device is used in particular in radio sets for displaying the presence of an audio signal.

However, this display device is complicated.

According to the second aspect, the object of the invention is to provide a simpler display device.

For this purpose, another subject of the invention is a display device comprising at least one light emitter as mentioned above and a support for fastening the light emitter, and the display device further includes means for delivering a variable voltage that are connected to the first electrode and to the second electrode, the delivery means being capable of generating a first voltage and a second voltage greater than the first voltage; only the first part of the organic layer is capable of emitting light when the first voltage is applied between the electrodes and the first and second parts of the organic layer are capable of emitting light when the second voltage is applied between the electrodes.

The invention will be more clearly understood on reading the following description, given solely by way of example and with reference to the drawings in which.

Figure 1:
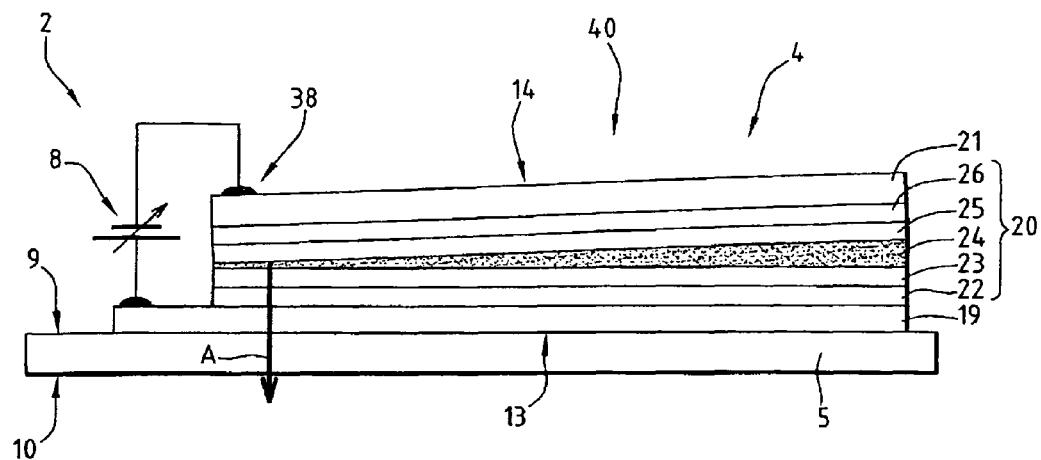
FIG. 1 is a schematic side view of a display device comprising an emitter according to a first embodiment of the invention, in which the device displays a first value of an input signal.
Figure 2:
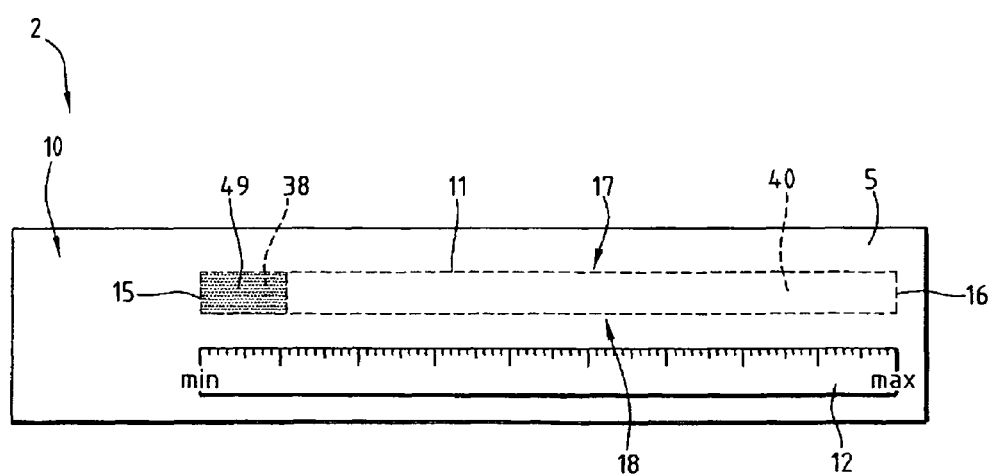
FIG. 2 is a schematic view from below of the display device illustrated in FIG. 1, in which the device displays the first value of the input signal.

A display device 2 comprising an emitter according to the first embodiment of the invention is illustrated schematically in FIGS. 1 and 2.

This display device 2 is a passive-matrix display device and is capable of giving a graphical representation of the value of a signal applied at its input.

It comprises an emitter 4, a substrate 5 for supporting the emitter 4 and means 8 for delivering a supply voltage to this emitter 4.

The substrate 5 consists of a transparent plate, for example made of glass or plastic. It has a thickness of between 0.7 and 1.1 millimeters.

The substrate 5 has a first main face 9 to which the emitter 4 is fastened and a second main face 10 opposite the first main face 9.

The second main face 10 has a rectangular zone 11 through which the light emitted by the emitter 4 can pass and a graduated scale 12 fastened along the zone 11.

The zone 11 has a shape and a size corresponding to the shape and size of the face of the emitter 4 fastened to the substrate 5. In the rest of the description, the zone 11 is called the display area.

The scale 12 is graduated continuously over a range of values corresponding to the possible values of the input signal.

The voltage delivery means 8 comprise a variable voltage generator capable of receiving an input signal and of delivering an output voltage.

The value of the output voltage is able to correspond to the value of the input signal according to a pre-established mapping. The mapping is carried out during a learning phase so as to bring the various possible values of the input signal into correspondence with the values of the voltage to be applied to the emitter 4 so that the illuminated zone of the display area corresponds to the value of the input signal on the scale 12.

The emitter 4 has the general form of a parallelepipedal array. It comprises a main face 13 fastened to the substrate 5 and a main face 14 opposite the face 13, a lateral side 15 facing the minimum value of the graduated scale 12, and a lateral side 16 opposite the side 15 and placed facing the maximum value of the graduated scale 12.

The emitter also has two longitudinal sides 17, 18.

The emitter 4 further includes an anode 19, an organic electroluminescent layer 20 deposited on the anode 19, and a cathode 21 deposited on the organic layer 20.

The anode 19 is formed by a transparent conductive layer which is connected to the anode of the voltage delivery means 8.

The anode 19 is formed from indium tin oxide, generally denoted by the acronym ITO. It has a constant thickness of about 100 to 150 nanometers and is deposited over the entire surface of the anode 19.

The organic layer 20 consists of several elementary layers, including at least one layer which is an organic layer.

In particular, it comprises an elementary hole transport layer 22 deposited on the anode 19 and an elementary electron blocking layer 23 deposited on the hole transport layer 22.

The hole transport layer 22 and the electron blocking layer 23 have a constant thickness of about 10 to 30 nanometers each.

The organic layer 20 also includes an elementary emissive layer 24 deposited on the electron blocking layer 23, an elementary hole blocking layer 25 deposited on the emissive layer 24, and an elementary electron transport layer 26 deposited on the hole blocking layer 25.

The emissive layer 24 is an organic layer formed for example from Alq3 (aluminum tris(8-hydroxyquinoline)). It has a thickness that varies between its ends, i.e. between its lateral side 15 and its opposed lateral side 16.

In particular, the thickness of the emissive layer 24 increases progressively, gradually and continuously and has a minimum thickness at the minimum value of the scale 12 and a maximum thickness at the maximum value of the scale 12.

The increase in thickness of the emissive layer 24 is capable of increasing the trigger threshold of the emitter 6, as will be described in the rest of the description.

Thus, the emissive layer 24 has an emissive layer part 38 adjacent the lateral side 15 and an emissive layer part 40 adjacent the lateral side 16, the thicknesses of which are different. In particular, the thickness of the part 38 is smaller than the thickness of the part 40.

For example, the thickness of the first part 38 of the emissive layer 24 is equal to 10 nanometers and the thickness of the second part 40 of the emissive layer 24 is equal to 100 nanometers.

The hole blocking layer 25 and the electron transport layer 26 have a constant thickness of greater than 2 nanometers and greater than 20 nanometers respectively.

The cathode 21 is formed by a reflective conductive layer 21 produced for example in a metallic material. It is connected to the cathode of the voltage delivery means 8 and has a constant thickness of between 100 and 200 nanometers. It is deposited over the entire surface of the electron transport layer 26.

As a variant, the thickness of the first part 38 of the emissive layer is greater than 10 nanometers.

As a variant, the thickness of the second part 40 of the emissive layer is less than 100 nanometers.

As a variant, the thickness of the emissive layer 24 is constant and the thickness of any one of the layers among the hole transport layer 25 and/or the electron blocking layer 23 and/or the hole blocking layer 25 and/or the electron transport layer 24 vary between the two ends of the emitter 4.

As a variant, the thickness of the emissive layer 24 increases exponentially between the part 38 and the part 40 so that the display area 11 is illuminated over a zone corresponding to the exponential of the value of the input signal.

In operation, the delivery means 8 initially receive an input value $V_{data1}$ of an input signal and generates a voltage V1 having a value corresponding to the input value $V_{data1}$.

When the voltage V1 is applied between the anode 19 and the cathode 21, holes and electrons are injected by the anode and by the cathode, respectively, into the organic layer 20.

The injected holes and electrons combine in the organic light-emitting layer 24 to form excitons. These become de-excited, emitting photons in the direction A so that the display area 11 is illuminated.

A part of predefined length of the emissive layer 24 emits photons when the value of the voltage applied between the anode 19 and the cathode 21 is above the trigger threshold of this part of the emissive layer 24.

When the voltage V1 with a value for example equal to 2.5 V is applied between the anode 19 and the cathode 21, a portion 49 of the display area is illuminated, as shown in FIGS. 1 and 2, so that the value of the input signal $V_{data1}$ corresponding to the voltage V1 may be read on the scale 12 by the user.

The portion 49 corresponds to that part of the emissive layer 24 having a trigger threshold below V1 and a thickness smaller than a first given value.

Next, the delivery means 8 receive an input value $V_{data2}$ of an input signal and generate a voltage V2 of value corresponding to the input value $V_{data2}$.

Figure 3:
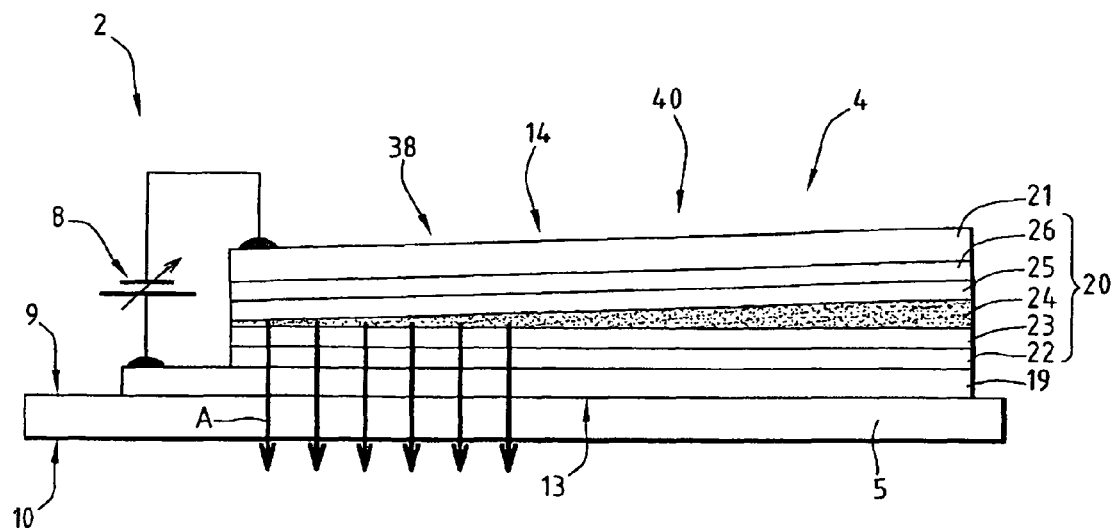
FIG. 3 is a view similar to the view in FIG. 1, in which the device displays a second value of the input signal.
Figure 4:
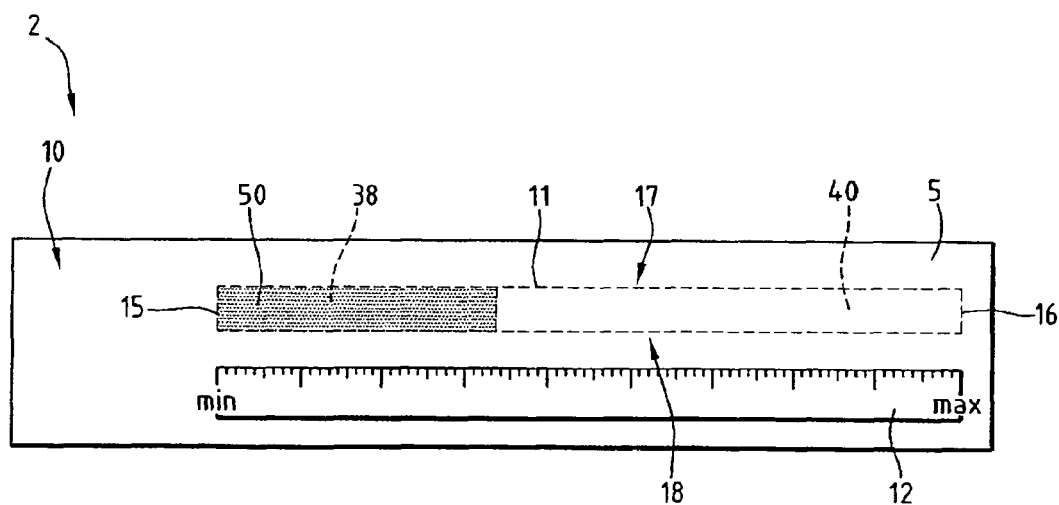
FIG. 4 is a view similar to the view in FIG. 2, in which the device displays the second value of the input signal.

When the voltage V2, having for example a value of 2.8 V, is applied between the anode 19 and the cathode 21, a portion 50 of the display area is illuminated, as may be seen in FIGS. 3 and 4. The portion 50 has a thickness smaller than a second given value, the second value being greater than the first value.

Since the value of the voltage V2 is above the value of the voltage V1, the portion 50 extends over a greater length of the display area than the portion 49. This is because a larger part of the emissive layer 24 has a trigger threshold below the voltage V2.

Thus, the display device 2 provides a visual representation of the values $V_{data1}$ and $V_{data2}$ of the input signal.

Figure 5:
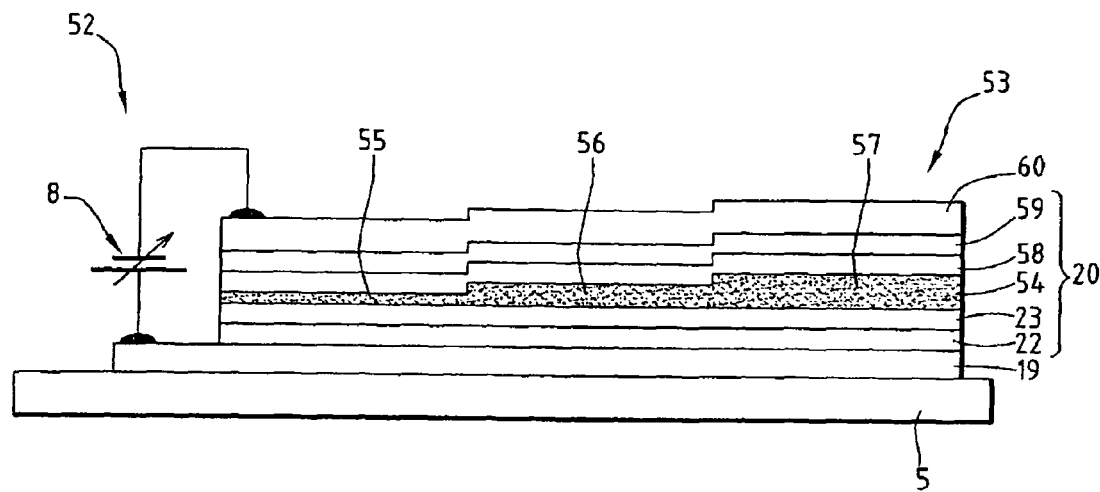
FIG. 5 is a schematic side view of the display device comprising an emitter according to a second embodiment of the invention.
Figure 6:
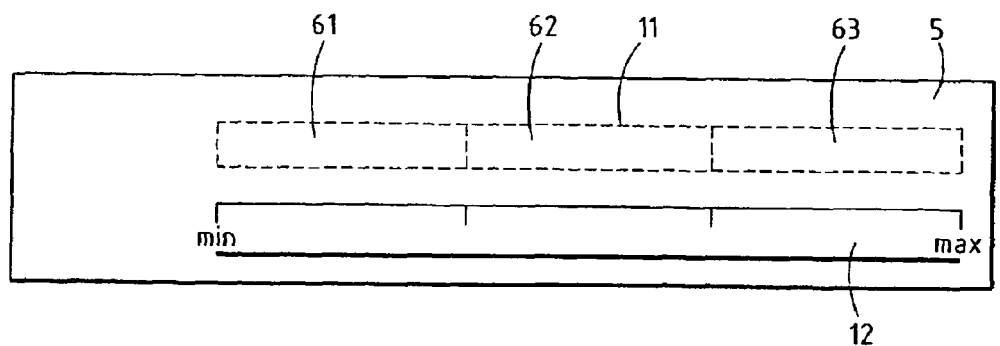
FIG. 6 is a schematic view from below of the display device illustrated in FIG. 5.

A display device 52 comprising an emitter 53 according to a second embodiment of the invention is illustrated in FIGS. 5 and 6.

The elements identical or similar to the elements of the display device 2 according to the first embodiment are referenced by the same reference numerals and will not be described again.

The display device 52 is capable of indicating three discrete levels illustrated in FIG. 6 and corresponding to three different voltage values and to three associated input values.

According to this second embodiment, the emitter 53 comprises an emitting layer 54 having three parts 55, 56, 57 of equal length and of different thickness, and the scale 12 comprises three graduations with a length equal to the length of each part 55, 56, 57.

In particular, the part 55 has a first constant thickness and is placed on the side corresponding to the minimum value of the scale 12.

The part 56 has a second constant thickness, greater than the first thickness.

The part 57 has a third constant thickness, greater than the second thickness.

The first, second and third thicknesses have a thickness for example equal to 10 nanometers, 40 nanometers and 70 nanometers respectively.

The emitter 53 further includes a hole blocking layer 58, an electron transport layer 59 and a cathode 60 having three parts of constant thickness with a length corresponding to the length of the parts 55, 56, 57.

Since the emissive layer 54 has the same thickness over the entire extent of a part 55, 57, all of this part 55, 56, 57 is capable of emitting light for a value of the voltage applied between the electrodes 17 and 19.

The display area 11 comprises three separate zones 61, 62, 63 placed facing the parts 55, 56, 57 and capable of being illuminated by the latter.

In operation, the part 55, the parts 55 and 56, and the parts 55, 56 and 57 are illuminated in succession for increasing values of voltage applied between the electrodes 19 and 60.

As a variant, the emissive layer 54 comprises two or more parts of different thickness.

As a variant, the parts 55, 56 and 57 have different lengths.

Figure 7:
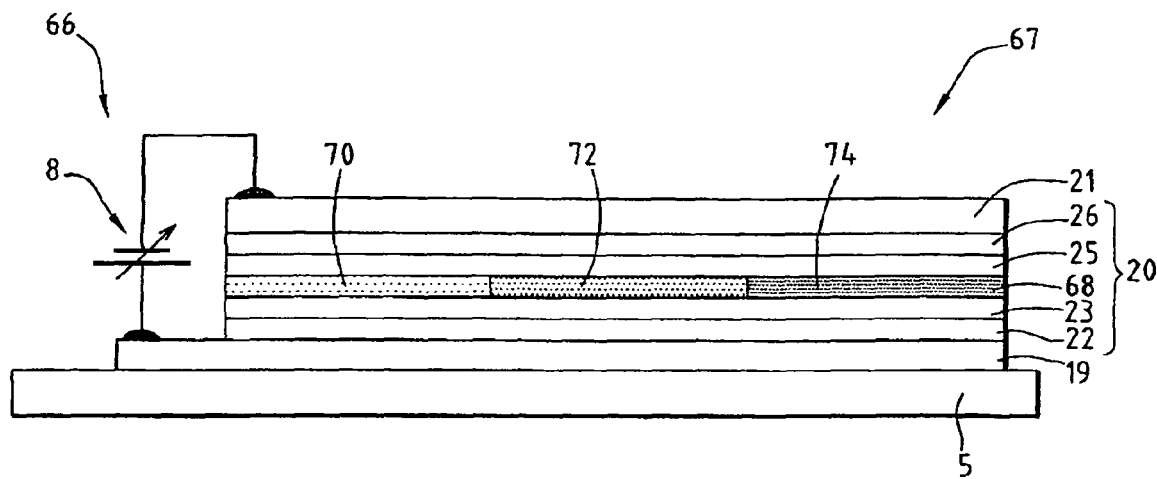
FIG. 7 is a schematic side view of the display device comprising an emitter according to a third embodiment of the invention.
Figure 8:
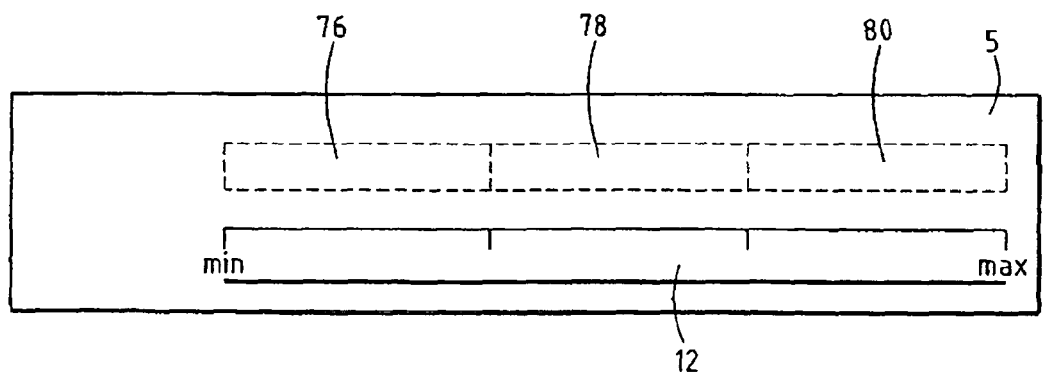
FIG. 8 is a schematic view from below of the display device illustrated in FIG. 7.

A display device 66 comprising an emitter 67 according to a third embodiment of the invention is illustrated in FIGS. 7 and 8.

The elements identical or similar to the elements of the display device 2 according to the first embodiment are referenced by the same reference numerals and will not be described again.

This display device 66 is capable of indicating three discrete levels corresponding to three different input values.

According to this third embodiment, the organic layer 20 includes an emissive layer 68 comprising three parts 70, 72, 74 having different levels of doping. The parts 70, 72, 74 are capable of emitting different colors depending on their level of doping. In particular, the emissive layer 68 is capable of emitting photons with a wavelength that depends on its composition.

The part 70 is doped by introducing a few percent of Irppy into a host material so that the part 70 of the emissive layer 68 is capable of emitting light of green color in a zone 76 of the display area facing the part 70.

The part 72 is doped by a few percent of particles sold under the name SEB020 or SEB021 by the registered trademark company MERCK in a host material sold under the name SEB010 by the registered trademark company MERCK so as to emit a blue color in a zone 78 of the display area placed facing the part 72.

Likewise, the part 74 is doped with another particle so as to emit another color in the zone 80 of the display area.

In operation, when a voltage V3, for example equal to 3.2 V, is applied between the anode 19 and the cathode 21, only the part 70 of the emissive layer 68 emits photons. These photons provide green light. Since the voltage V3 is below the trigger threshold of the parts 72 and 74 of the emissive layer 68, these parts do not emit photons.

When a voltage V4, for example equal to 3.4 V, is applied between the anode 19 and the cathode 21, the part 70 and the part 72 of the emissive layer 68 are capable of emitting photons that provide green light and blue light respectively.

Thus, the zones 76 and 78 of the display area are illuminated in two different colors. The part 74 does not emit photons since the voltage V4 is below the trigger threshold voltage for the part 74 of the emissive layer.

As a variant, three arrays having the same composition over their entire thickness and having compositions that differ from one another are arranged between the same two electrodes 17, 19.

As a variant, the composition and the doping of the parts 70, 72 and 74 vary progressively.

As a variant, the composition of the emissive layer 68 is constant and the electron transport layer and/or the hole transport layer 22 comprise three parts, the composition of which varies so as to provide a visual representation of three input values in different colors.

As a variant, the organic layer 20 comprises two or three elements fabricated independently of one another and arranged beside one another between the same two electrodes 19, 21. The emissive layers of each element are doped with different components so that each element has as a different trigger threshold and is capable of emitting a different color.

As a variant, the organic layer 20 comprises a single emissive layer placed between the two electrodes 19, 21.

As a variant, the organic layer 20 comprises a thickness variation and a variation in its composition.

As a variant, the organic layer 20 has main faces 13, 14 in the form of a circular sector or in the form of a circle or polygon Advantageously, this display device does not require a driver, so that it is simpler to fabricate and is less expensive.

Advantageously, this display device is compact.

The invention claimed is:

1. A light emitter comprising two electrodes facing each other and at least one organic layer capable of emitting light,
    wherein the organic layer comprises at least a first part and a second part that are placed between the same two electrodes, the first part of the organic layer having a lower level of doping than the level of doping of the second part of the organic layer,
    wherein a thickness and/or a composition of the first part are/is different from said thickness and/or said composition of the second part, said thickness being defined between the two electrodes,
    wherein the organic layer comprises two ends, the first part of the organic layer being placed at one end of the organic layer and a second part of the organic layer being placed at the other end of the organic layer, and
    wherein the organic layer extends continuously between the two ends.

2. The light emitter as claimed in claim 1, wherein said thickness and/or said composition of the organic layer vary/varies continuously from the first part of the organic layer to the second part of the organic layer.

3. The light emitter as claimed in claim 1, wherein said thickness and/or said composition of the organic layer vary/varies in steps from the first part of the organic layer to the second part of the organic layer.

4. The light emitter as claimed in claim 1, wherein the thickness of the first part of the organic layer is smaller than the thickness of the second part of the organic layer, and wherein the trigger threshold voltage for the first part of the organic layer is below the trigger threshold voltage for the second part of the organic layer.

5. The light emitter as claimed in claim 1, wherein the thickness of the first part of the organic layer is equal to or greater than 10 nanometers.

6. The light emitter as claimed in claim 1, wherein the thickness of the second part of the organic layer is equal to or less than 100 nanometers.

7. The light emitter as claimed in claim 1, wherein the first part and the second part of the organic layer are two independent layer elements placed between the same two electrodes.

8. A display device comprising at least one light emitter as claimed in claim 1 and a support for fastening the light emitter, wherein it further includes means for delivering a variable voltage that are connected to the first electrode and to the second electrode, the delivery means being capable of generating a first voltage and a second voltage greater than the first voltage; and wherein only the first part of the organic layer is capable of emitting light when the first voltage is applied between the electrodes and wherein the first and second parts of the organic layer are capable of emitting light when the second voltage is applied between the electrodes.

9. The display device as claimed in claim 8, wherein the delivery means comprise an input suitable for receiving an input signal and at least one output capable of delivering a variable output voltage, the value of the output voltage being able to correspond to the value of the input signal so that the display device is capable of providing a visual representation of the value of the input signal.

10. A light emitter comprising two electrodes facing each other and at least one organic layer capable of emitting light, wherein the organic layer comprises at least a first part and a second part placed between the same two electrodes, wherein a thickness and/or a composition of the first part are/is different from said thickness and/or said composition of the second part, said thickness being defined between the two electrodes, wherein said organic layer comprises at least one elementary layer, the thickness and/or the composition of which vary/varies, wherein said elementary layer is chosen from the set of layers comprising an emissive layer, an electron transport layer and a hole transport layer and further including a hole blocking layer and an electron blocking layer, and wherein the organic layer comprises two ends, the first part of the organic layer being placed at one end of the organic layer and a second part of the organic layer being placed at the other end of the organic layer and wherein the organic layer extends continuously between the two opposite ends.

11. The light emitter as claimed in claim 10, wherein said thickness and/or said composition of the organic layer vary/varies continuously from the first part of the organic layer to the second part of the organic layer.

12. The light emitter as claimed in claim 10, wherein said thickness and/or said composition of the organic layer vary/varies in steps from the first part of the organic layer to the second part of the organic layer.

13. The light emitter as claimed in claim 10, wherein the thickness of the first part of the organic layer is smaller than the thickness of the second part of the organic layer, and wherein the trigger threshold voltage for the first part of the organic layer is below the trigger threshold voltage for the second part of the organic layer.

14. The light emitter as claimed in claim 10, wherein the thickness of the first part of the organic layer is equal to or greater than 10 nanometers.

15. The light emitter as claimed in claim 10, wherein the thickness of the second part of the organic layer is equal to or less than 100 nanometers.

16. The light emitter as claimed in claim 10, wherein the first part and the second part of the organic layer are two independent layer elements placed between the same two electrodes.

17. A display device comprising at least one light emitter as claimed in claim 10 and a support for fastening the light emitter, wherein it further includes means for delivering a variable voltage that are connected to the first electrode and to the second electrode, the delivery means being capable of generating a first voltage and a second voltage greater than the first voltage; and wherein only the first part of the organic layer is capable of emitting light when the first voltage is applied between the electrodes and wherein the first and second parts of the organic layer are capable of emitting light when the second voltage is applied between the electrodes.

18. The display device as claimed in claim 17, wherein the delivery means comprise an input suitable for receiving an input signal and at least one output capable of delivering a variable output voltage, the value of the output voltage being able to correspond to the value of the input signal so that the display device is capable of providing a visual representation of the value of the input signal.

* * * * *